United States Patent
Reed et al.

(10) Patent No.: US 9,218,979 B2
(45) Date of Patent: Dec. 22, 2015

(54) LOW RESISTIVITY OHMIC CONTACT

(71) Applicant: Phononic Devices, Inc., Durham, NC (US)

(72) Inventors: Jason D. Reed, Chapel Hill, NC (US); Jaime A. Rumsey, Holly Springs, NC (US); Ronald R. Hess, Oak Ridge, NC (US); Arthur Prejs, Cary, NC (US); Ian Patrick Wellenius, Raleigh, NC (US); Allen L. Gray, Holly Springs, NC (US)

(73) Assignee: Phononic Devices, Inc., Durham, NC (US)

( * ) Notice: Subject to any disclaimer, the term of this patent is extended or adjusted under 35 U.S.C. 154(b) by 0 days.

(21) Appl. No.: 14/599,123

(22) Filed: Jan. 16, 2015

(65) Prior Publication Data

US 2015/0200098 A1    Jul. 16, 2015

Related U.S. Application Data

(60) Provisional application No. 61/928,113, filed on Jan. 16, 2014.

(51) Int. Cl.
*H01L 31/0224* (2006.01)
*H01L 21/44* (2006.01)
(Continued)

(52) U.S. Cl.
CPC ............ *H01L 21/283* (2013.01); *C23C 28/021* (2013.01); *C23C 28/023* (2013.01); *H01L 21/02562* (2013.01); *H01L 29/66068* (2013.01); *H01L 31/02363* (2013.01); *H01L 31/022425* (2013.01); *H01L 31/022458* (2013.01);
(Continued)

(58) Field of Classification Search
CPC .................. H01L 29/66068; H01L 21/02562; H01L 31/022425; H01L 31/022458; H01L 31/02363; H01L 31/22

USPC .......... 257/739, 750, 751, 766; 438/652–654, 438/656, 665
See application file for complete search history.

(56) References Cited

U.S. PATENT DOCUMENTS

| | | | |
|---|---|---|---|
| 3,208,835 A | 9/1965 | Duncan et al. | |
| 3,528,893 A | 9/1970 | Christie et al. | |
| 4,081,895 A | 4/1978 | Germano et al. | |
| 6,288,321 B1 * | 9/2001 | Fleurial et al. | 136/205 |
| 6,869,712 B2 * | 3/2005 | Mittelstadt et al. | 429/479 |

(Continued)

OTHER PUBLICATIONS

Lin, Wen P. et al., "Barrier/bonding layers on bismuth telluride ($Bi_2Te_3$) for high temperature thermoelectric modules," Journal of Materials Science: Materials in Electronics, vol. 22, No. 9, Sep. 2011 (published online Jan. 26, 2011 by the authors), Springer US, 17 pages.

(Continued)

*Primary Examiner* — Marvin Payen
*Assistant Examiner* — Jeremy Joy
(74) *Attorney, Agent, or Firm* — Withrow & Terranova, PLLC

(57) ABSTRACT

Embodiments of a low resistivity ohmic contact are disclosed. In some embodiments, a method of fabricating a low resistivity ohmic contact includes providing a semiconductor material layer and intentionally roughening the semiconductor material layer to create a characteristic surface roughness. The method also includes providing an ohmic contact metal layer on a surface of the semiconductor material layer and providing a diffusion barrier metal layer on a surface of the ohmic contact metal layer opposite the semiconductor material layer. In this way, the adhesive force between the semiconductor material layer and the ohmic contact metal layer may be increased.

14 Claims, 5 Drawing Sheets

(51) Int. Cl.
*H01L 21/283* (2006.01)
*H01L 35/02* (2006.01)
*H01L 35/34* (2006.01)
*H01L 21/02* (2006.01)
*H01L 29/66* (2006.01)
*H01L 31/0236* (2006.01)
*H01L 33/22* (2010.01)
*C23C 28/02* (2006.01)
*H01L 35/16* (2006.01)

(52) U.S. Cl.
CPC ................ *H01L33/22* (2013.01); *H01L 35/02* (2013.01); *H01L 35/16* (2013.01); *H01L 35/34* (2013.01)

(56) References Cited

U.S. PATENT DOCUMENTS

| | | | |
|---|---|---|---|
| 2003/0128483 A1* | 7/2003 | Kamijo | 360/324.11 |
| 2005/0016969 A1* | 1/2005 | Kessler et al. | 219/121.6 |
| 2011/0192457 A1* | 8/2011 | Nakayama et al. | 136/256 |
| 2012/0161084 A1* | 6/2012 | Malik et al. | 252/519.4 |
| 2012/0217165 A1* | 8/2012 | Feng et al. | 205/135 |
| 2013/0068301 A1* | 3/2013 | Wang et al. | 136/258 |
| 2014/0191398 A1* | 7/2014 | Gaska et al. | 257/739 |

OTHER PUBLICATIONS

International Search Report and Written Opinion for International Patent Application No. PCT/US2015/011816, mailed May 27, 2015, 13 pages.

* cited by examiner

LOW RESISTIVITY OHMIC CONTACT

RELATED APPLICATIONS

This application claims the benefit of provisional patent application Ser. No. 61/928,113, filed Jan. 16, 2014, the disclosure of which is hereby incorporated herein by reference in its entirety.

FIELD OF THE DISCLOSURE

The present disclosure relates to a low resistivity electrical contact to a semiconductor structure.

BACKGROUND

Thermoelectric devices, namely thermoelectric power generators and coolers, have emerged as promising green technology. In general, thermoelectric devices offer the ability to convert waste-heat energy into electrical power or provide cooling from a solid state device. Applications of thermoelectric devices range from electronic thermal management to solid state refrigeration to power generation from waste heat sources. The figure-of-merit (ZT) of a thermoelectric material is a dimensionless unit that is used to compare the efficiencies of various materials. The figure-of-merit (ZT) is determined by three physical parameters, namely, thermopower $\alpha$ (also known as a Seebeck coefficient), electrical conductivity $\sigma$, thermal conductivity k, and absolute temperature T.

$$ZT = \frac{\alpha^2 \sigma}{k} T.$$

Maximum ZT in bulk thermoelectric materials is governed by the intrinsic properties of the material system. Most candidates require low thermal conductivity as the driving force for enhanced ZT because of the inverse relationship between the Seebeck coefficient and electrical conductivity. This interdependence and coupling between the Seebeck coefficient and the electrical conductivity have made it difficult to increase ZT>1, despite nearly five decades of research.

While the intrinsic properties of the thermoelectric material are the primary factors that drive the efficiency of a thermoelectric device, performance is also limited by both parasitic electrical and thermal resistances present in the thermoelectric device. The parasitic electrical resistance is primarily due to a barrier to current flow that forms when an external metal electrode is applied to the surface of the thermoelectric material. A barrier formed at the metal-thermoelectric interface (which is a metal-semiconductor interface) introduces resistance that is detrimental to the performance of the thermoelectric device. The ideal ohmic contact to a semiconductor material follows the relationship:

$$\rho_c = \frac{\partial V}{\partial J}\bigg|_{V=0} \Omega \cdot cm^2,$$

where $\rho_c$ is a contact resistivity of the ohmic contact, J is current density, and V is voltage. Low contact resistivity increases the performance of devices especially with thermoelectric leg dimensions in the range of 0.01 to 1 Millimeters (mm), and even more so with thermoelectric leg dimensions in the range of 0.01 to 0.5 mm where parasitic losses from the ohmic contacts become a major limit to the performance.

The thermoelectric material is generally a semiconductor, and the ohmic contact is generally a metal. In this case, one of the primary causes of high resistivity at the metal-semiconductor interface is a potential barrier that restricts the flow of charge carriers across the metal-semiconductor interface. It is thus important to select an ohmic contact metal that is a very close match in work function to the semiconductor such that the barrier height is small, in the range of 0.0 to 0.5 Volts (V) and preferably in the range of 0.0 to 0.3V.

Current thermoelectric devices have ohmic contacts with a contact resistivity in the range of $1 \times 10^{-6}$ ohms-centimeter$^2$ $(\Omega^*cm)^2$ or above. This resistivity leads to losses in performance that become severe as the size of the thermoelectric legs in the device is reduced.

A further desirable feature of an ohmic contact to a thermoelectric material is a strong adhesive force between the metal and semiconductor surface. When the adhesive force between the metal and semiconductor surface is not sufficiently high, the device may be inoperable or fail earlier than desired. Many combinations of metal and semiconductor, which would be desirable because they would form an ohmic contact with low resistivity, do not have a sufficiently high the adhesive force between them.

As such, there is a need for systems and methods for increasing the adhesive force between a semiconductor material layer and an ohmic contact metal layer to provide a low resistivity ohmic contact.

SUMMARY

Embodiments of a low resistivity ohmic contact are disclosed. In some embodiments, a method of fabricating a low resistivity ohmic contact includes providing a semiconductor material layer and intentionally roughening the semiconductor material layer to create a characteristic surface roughness. The method also includes providing an ohmic contact metal layer on a surface of the semiconductor material layer and providing a diffusion barrier metal layer on a surface of the ohmic contact metal layer opposite the semiconductor material layer. In this way, the adhesive force between the semiconductor material layer and the ohmic contact metal layer may be increased.

In some embodiments, the characteristic surface roughness has an $R_a$=0.1 micrometer ($\mu$m) to 2 $\mu$m, where $R_a$ is the arithmetic average of a roughness profile of the semiconductor material layer. In some embodiments, the characteristic surface roughness has an $R_a$=0.75 $\mu$m to 1.25 $\mu$m. In some embodiments, the method also includes providing an adhesion metal layer on the surface of the semiconductor material layer and providing the ohmic contact metal layer on a surface of the adhesion metal layer.

In some embodiments, the semiconductor material layer is an alloy of Bismuth Telluride. In some embodiments, the semiconductor material layer is $Bi_2(Te_xSe_{1-x})_3$ or $(Sb_yBi_{1-y})_2(Te_xSe_{1-x})_3$. In some embodiments, the semiconductor material layer has a carrier concentration between $1*10^{19}$ carriers/centimeter (cm)$^3$ to $3*10^{21}$ carriers/cm$^3$. In some embodiments, the semiconductor material layer has a carrier concentration between $1*10^{20}$ carriers/cm$^3$ to $1*10^{21}$ carriers/cm$^3$.

In some embodiments, the ohmic contact metal layer is Nickel, Cobalt, or an alloy of Nickel and Cobalt. In some embodiments, the ohmic contact metal layer is Cobalt.

In some embodiments, the adhesion metal layer is chosen from the group consisting of the transition metals. In some embodiments, the adhesion metal layer is between 1 and 20 nanometers (nm) thick. In some embodiments, the adhesion metal layer is between 5 and 10 nm thick.

In some embodiments, the diffusion barrier metal layer is Nickel. In some embodiments, the method also includes cleaning the surface of the semiconductor material layer.

In some embodiments, a low resistivity ohmic contact includes a semiconductor material layer with a surface roughness $R_a=0.1$ μm to 2 μm, an ohmic contact metal layer on a surface of the semiconductor material layer, and a diffusion barrier metal layer on a surface of the ohmic contact metal layer opposite the semiconductor material layer. In some embodiments, the low resistivity ohmic contact also includes an adhesion metal layer on the surface of the semiconductor material layer, and the ohmic contact metal layer is on a surface of the adhesion metal layer.

In some embodiments, the semiconductor material layer is an alloy of Bismuth Telluride having a carrier concentration between $1*10^{19}$ carriers/cm$^3$ to $3*10^{21}$ carriers/cm$^3$, the adhesion metal layer a transition metal and is between 1 and 20 nm thick, the ohmic contact metal layer is Cobalt, and the diffusion barrier metal layer is Nickel.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
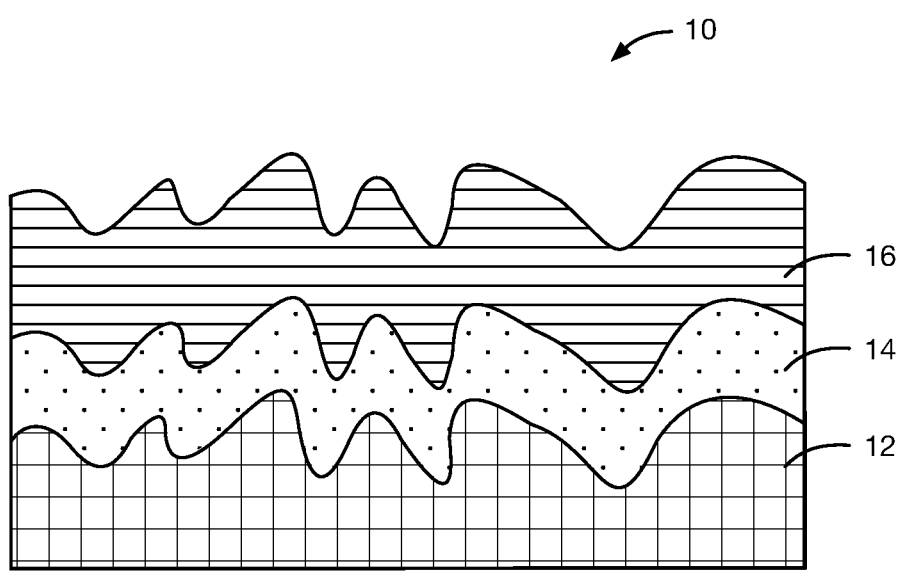
FIG. 1 illustrates a low resistivity ohmic contact according to some embodiments of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 illustrates a semiconductor structure (e.g., a p or n type leg of a thermoelectric device) 10 having a low resistivity ohmic contact according to some embodiments of the present disclosure. The semiconductor structure 10 includes a semiconductor material layer 12 with a characteristic surface roughness, an ohmic contact metal layer 14 on a surface of the semiconductor material layer 12, and a diffusion barrier metal layer 16 on a surface of the ohmic contact metal layer 14 opposite the semiconductor material layer 12. The characteristic surface roughness of the semiconductor material layer 12, which as discussed below is provided by intentionally roughening the surface of the semiconductor material layer 12, allows the adhesive force between the semiconductor material layer 12 and the ohmic contact metal layer 14 to be increased, according to some embodiments. This may enable the use of many combinations of material to be used for the semiconductor material layer 12 and the ohmic contact metal layer 14 that, without the characteristic surface roughness, would not have sufficiently high adhesion force between them. In particular, the characteristic surface roughness of the semiconductor material enables the use of combinations of materials for the semiconductor material layer 12 (materials having desired thermoelectric properties giving rise to a high figure of merit ZT) and materials for the ohmic contact metal layer 14 that would otherwise not be possible due to poor adhesion.

Figure 2A:
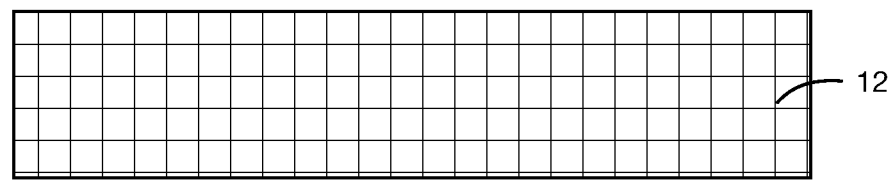
FIGS. 2A-2F illustrate exemplary structures after various steps of a method of fabricating the low resistivity ohmic contact of FIG. 1, according to some embodiments of the present disclosure.

FIGS. 2A-2F graphically illustrate a method of fabricating the semiconductor structure 10 of FIG. 1 according to some embodiments of the present disclosure. FIG. 2A illustrates a provided semiconductor material layer 12. The semiconductor material layer 12 may be a bulk semiconductor material or a layer(s) of one or more semiconductor materials epitaxially grown on a substrate (not shown). In some embodiments, the semiconductor material layer 12 is an alloy of Bismuth Telluride. Alloys of Bismuth Telluride have desirable thermoelectric properties and, as such, are desirable thermoelectric materials. In some embodiments, the semiconductor material layer 12 is $Bi_2(Te_xSe_{1-x})_3$ or $(Sb_yBi_{1-y})_2(Te_xSe_{1-x})_3$.

In addition to a potential barrier that restricts the flow of charge carriers, a second cause of high resistivity is a reduced amount of charge carriers in the semiconductor material layer 12 that serve to transport electrical energy in the thermoelectric material. As such, it is beneficial to have a semiconductor material layer 12 that is highly doped. In some embodiments, the semiconductor material layer has a carrier concentration in the range of and including $1*10^{19}$ carriers/centimeter $(cm)^3$ to $3*10^{21}$ carriers/cm$^3$. In other embodiments, the semiconductor material layer has a carrier concentration in the range of and including $1*10^{20}$ carriers/cm$^3$ to $1*10^{21}$ carriers/cm$^3$.

Figure 2B:
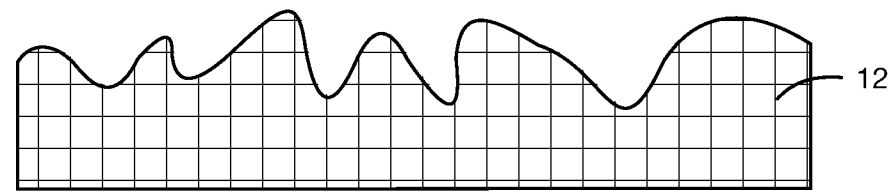

As illustrated in FIG. 2B, the surface of the semiconductor material layer 12 is intentionally roughened to create a characteristic surface roughness. The surface of the semiconductor material layer 12 may be roughened using any suitable technique(s). For example, the surface of the semiconductor material layer 12 may be intentionally roughened using singly or in combination: electrical discharge machining, sawing, abrasion and etching by wet or dry (plasma etching) method.

In some embodiments, the characteristic surface roughness after the intentional roughening of the surface is in the range of and including $R_a=0.1$ micrometer (μm) to 2 μm, and in some particular embodiments in the range of and including $R_a=0.75$ to 1.25 μm. Here, $R_a$ is the arithmetic average of a roughness profile of the semiconductor material layer 12. $R_a$ can be calculated as:

$$R_a = \frac{1}{n}\sum_{i=1}^{n} |y_i|$$

where the roughness profile contains n equally spaced measurements along the roughness profile and $y_i$ is the height from the mean height to the $i^{th}$ data point. Several other measures of roughness exist such as a root mean squared roughness, a maximum valley depth roughness, a maximum peak height roughness, and others. There are also roughness measures that are calculated on a surface instead of a profile. While only $R_a$ values are discussed herein, any of these roughness measurements could be used to ascertain the required level of characteristic surface roughness of the semiconductor material layer 12. Regardless of the type of measurement used to characterize the characteristic surface roughness, the characteristic surface roughness of the semiconductor material layer 12 after the intentional roughening of the surface is greater (and preferably substantially greater than) than the roughness of the surface prior to the intentional roughening.

After intentionally roughening the surface of the semiconductor material layer 12, the surface of the semiconductor material layer 12 may optionally be cleaned. While any suitable cleaning technique(s) may be used, in some embodiments, the surface of the semiconductor material layer 12 is cleaned via holding the surface of the semiconductor material layer 12 in a high vacuum state for an appropriate amount of time and/or performing a sputter and/or wet etch on the surface of the semiconductor material layer 12. For example, in some embodiments, the surface of the semiconductor material layer 12 is held in a high vacuum state, preferably less than $5*10^{-5}$ pascals (Pa), for a time ranging from 1 to 10 minutes (preferably 5 to 10 minutes) to allow volatile absorbed materials to evaporate. In addition or alternatively, in order to remove nonvolatile absorbed materials, a sputter etch is performed on the surface of the semiconductor material layer 12 in situ with an inert gas such as Argon, in some embodiments. Further, in some embodiments, a final wet etch is performed on the surface of the semiconductor material layer 12 in order to remove residue. These material removal steps are beneficial to remove absorbed materials or to remove damaged or oxidized layers of the semiconductor material layer 12 to expose a surface of the semiconductor that has the required charge carrier level and is structurally sound. The removal and control of the formation of extrinsic surface states is particularly beneficial since these extrinsic states, caused by absorbed materials or semiconductor oxides, impede the flow of carriers between the ohmic contact metal layer 14 and the semiconductor material layer 12.

Figure 2C:
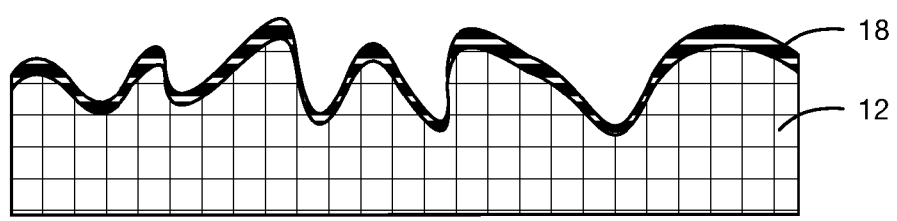

After intentionally roughening and, in some embodiments, cleaning the surface of the semiconductor material layer 12, an optional adhesion metal layer 18 is formed or otherwise provided on, or preferably directly on, the surface of the semiconductor material layer 12, as illustrated in FIG. 2C. The adhesion metal layer 18 may be chosen from the transition metals (i.e., Scandium, Titanium, Vanadium, Chromium, Manganese, Iron, Cobalt, Nickel, Copper, Zinc, Yttrium, Zirconium, Niobium, Molybdenum, Ruthenium, Rhodium, Palladium, Silver, Cadmium, Lanthanum, Hafnium, Tantalum, Tungsten, Rhenium, Osmium, Iridium, Platinum, Gold, and Mercury). In some embodiments, the adhesion metal layer 18 is between 1 and 20 nanometers (nm) thick. In other embodiments, the adhesion metal layer 18 is between 5 and 10 nm thick. The use of a thin highly adhesive adhesion metal layer 18 between the semiconductor material layer 12 and the ohmic contact metal layer 14 can greatly increase the adhesive force between the semiconductor material layer 12 and the ohmic contact metal layer 14. The adhesion metal layer 18 does not appreciably increase the resistivity of the low resistivity ohmic contact in the semiconductor structure 10. In some embodiments, the adhesion metal layer 18 is applied by a vacuum deposition method such as physical vapor deposition (sputtering) and evaporation, preferably by physical vapor deposition.

Figure 2D:
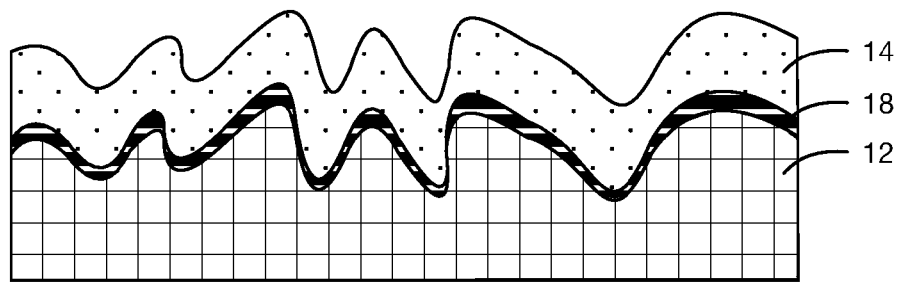

Next, as illustrated in FIG. 2D, the ohmic contact metal layer 14 is formed or otherwise provided on, or preferably directly on, the surface of the adhesion metal layer 18 opposite the semiconductor material layer 12 (or alternatively on the surface of the semiconductor material layer 12 in embodiments where there is no adhesion metal layer 18). The adhesive force created by intentionally roughening the surface of the semiconductor material layer 12, optionally cleaning the surface of the semiconductor material layer 12, and optionally using the adhesion metal layer 18 allows for fewer restrictions in choosing the ohmic contact metal layer 14. Very low ohmic contact resistance is created by the choice of a material(s) for the ohmic contact metal layer 14 that has a very low barrier height with respect to the semiconductor material layer 12. Thus, the dual constraint for the ohmic contact metal layer 14 to provide both the desired adhesion force and the desired low ohmic contact resistance is relieved. The material(s) used for the ohmic contact metal layer 14 can be selected to provide a very low barrier height, e.g., in the range of and including 0.0 to 0.3 volts (V) with respect to the semiconductor material layer 12 to thereby minimize the ohmic contact resistance. Metals in this group include but are not limited to Nickel, Cobalt, alloys of Nickel, and alloys of Cobalt which are particularly beneficial when the semiconductor material layer 12 is Bismuth Telluride. In some embodiments, the ohmic contact metal layer 14 is Cobalt. In some embodiments, the ohmic contact metal layer 14 is formed by a vacuum deposition process such as physical vapor deposition (sputtering) and evaporation, preferably by physical vapor deposition.

Figure 2E:
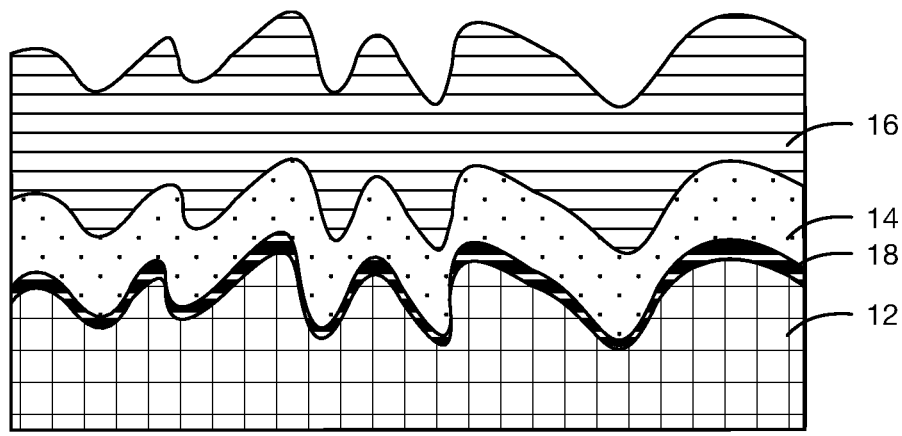

In some embodiments, the diffusion barrier metal layer 16 is formed or otherwise provided on, or in some embodiments directly on, the surface of the ohmic contact metal layer 14 opposite the adhesion metal layer 18 or semiconductor material layer 12, as illustrated in FIG. 2E. In some embodiments, the diffusion barrier metal layer 16 is Nickel. However, the diffusion barrier metal layer 16 is not limited thereto. Further, the diffusion barrier metal layer 16 may include one layer or multiple layers of the same or different metals or metal alloys. In some embodiments, the diffusion barrier metal layer 16 is formed by physical vapor deposition, evaporation, plating, or other processes.

Figure 2F:
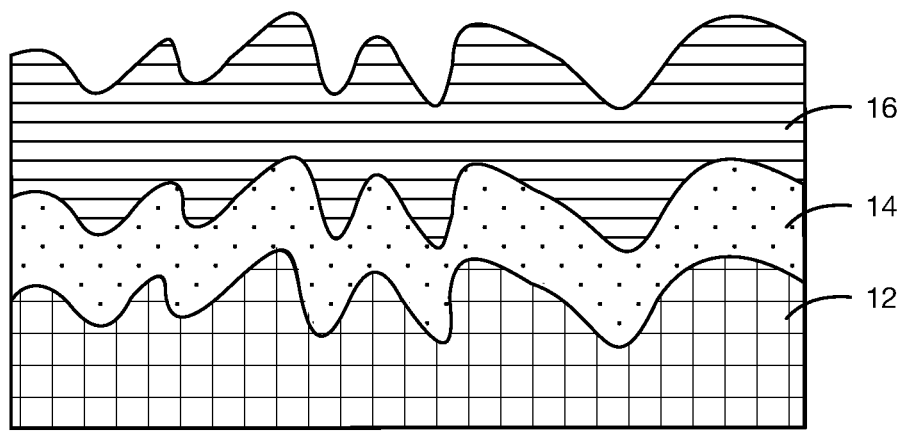

FIG. 2F illustrates the semiconductor structure 10 after it has been exposed to high heat, such as by annealing or during a solder reflow process. As illustrated, in some embodiments, the adhesion metal layer 18 diffuses into one or more of the other layers such as the semiconductor material layer 12, the ohmic contact metal layer 14, and/or the diffusion barrier metal layer 16 as a result of this heating.

Figure 3:
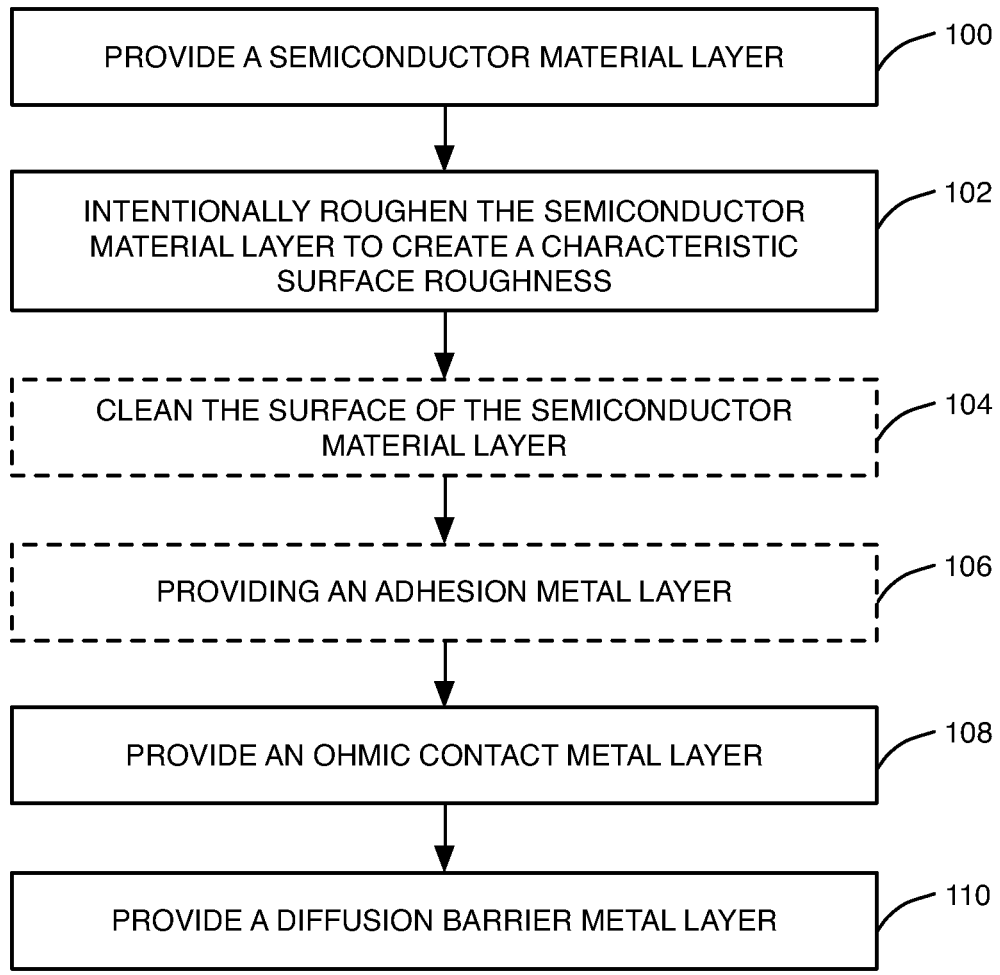
FIG. 3 illustrates a method of fabricating the low resistivity ohmic contact of FIG. 1, according to some embodiments of the present disclosure.

FIG. 3 is a flow chart that illustrates a method of fabricating the semiconductor structure 10 of FIG. 1, according to some embodiments of the present disclosure. The method includes providing a semiconductor material layer 12 (step 100) as discussed above in relation to FIG. 2A. Next, the method includes intentionally roughening the semiconductor material layer 12 to create a characteristic surface roughness (step 102). This roughening is accomplished as discussed above in relation to FIG. 2B. The method then optionally includes cleaning the surface of the semiconductor material layer 12 (step 104) as discussed above in relation to FIG. 2B. The method then optionally includes providing an adhesion metal layer 18 (step 106) as discussed above in relation to FIG. 2C. Next, the method includes providing an ohmic contact metal layer 14 (step 108) as discussed above in relation to FIG. 2D. Finally, the method includes providing a diffusion barrier metal layer 16 (step 110) as discussed above in relation to FIG. 2E.

Those skilled in the art will recognize improvements and modifications to the preferred embodiments of the present disclosure. All such improvements and modifications are considered within the scope of the concepts disclosed herein and the claims that follow.

What is claimed is:

1. A method of fabricating a low resistivity ohmic contact comprising:
   providing a semiconductor material layer that is an alloy of Bismuth Telluride;
   intentionally roughening the semiconductor material layer to create a characteristic surface roughness that has an $R_a=0.1$ μm to 2 μm, where $R_a$ is the arithmetic average of a roughness profile of the semiconductor material layer;
   providing an adhesion metal layer on the surface of the semiconductor material layer;
   providing an ohmic contact metal layer on a surface of the adhesion metal layer; and
   providing a diffusion barrier metal layer on a surface of the ohmic contact metal layer opposite the semiconductor material layer.

2. The method of claim 1 wherein the characteristic surface roughness has an $R_a=0.75$ μm to 1.25 μm.

3. The method of claim 1 wherein the semiconductor material layer is chosen from the group consisting of $Bi_2(Te_xSe_{1-x})_3$ and $(Sb_yBi_{1-y})_2\{Te_xSe_{1-x}\}_3$ where $0<x<1$ and $0<y<1$.

4. The method of claim 1 wherein the semiconductor material layer has a carrier concentration between $1*10^{19}$ carriers/cm$^3$ to $3*10^{21}$ carriers/cm$^3$.

5. The method of claim 4 wherein the semiconductor material layer has a carrier concentration between $1*10^{20}$ carriers/cm$^3$ to $1*10^{21}$ carriers/cm$^3$.

6. The method of claim 1 wherein the ohmic contact metal layer is chosen from the group consisting of Nickel, Cobalt, an alloy of Nickel, and an alloy of Cobalt.

7. The method of claim 6 wherein the ohmic contact metal layer is Cobalt.

8. The method of claim 1 wherein the adhesion metal layer is chosen from the group consisting of the transition metals.

9. The method of claim 1 wherein the adhesion metal layer is between 1 and 20 nm thick.

10. The method of claim 9 wherein the adhesion metal layer is between 5 and 10 nm thick.

11. The method of claim 1 wherein the diffusion barrier metal layer is Nickel.

12. The method of claim 1 further comprising cleaning the surface of the semiconductor material layer.

13. A low resistivity ohmic contact comprising:
   a semiconductor material layer that is an alloy of Bismuth Telluride with a surface roughness $R_a=0.1$ μm to 2 μm, where $R_a$ is the arithmetic average of a roughness profile of the semiconductor material layer;
   an adhesion metal layer on the surface of the semiconductor material layer;
   an ohmic contact metal layer on a surface of the adhesion metal layer; and
   a diffusion barrier metal layer on a surface of the ohmic contact metal layer opposite the semiconductor material layer.

14. The low resistivity ohmic contact of claim 13 wherein:
   the semiconductor material layer has a carrier concentration between $1*10^{19}$ carriers/cm$^3$ to $3*10^{21}$ carriers/cm$^3$;
   the adhesion metal layer is chosen from the group consisting of the transition metals and is between 1 and 20 nm thick;
   the ohmic contact metal layer is Cobalt; and
   the diffusion barrier metal layer is Nickel.

* * * * *